(12) United States Patent
Wakatsuki et al.

(10) Patent No.: US 9,312,207 B2
(45) Date of Patent: Apr. 12, 2016

(54) SEMICONDUCTOR DEVICE

(71) Applicant: Kabushiki Kaisha Toshiba, Tokyo (JP)

(72) Inventors: Satoshi Wakatsuki, Mie (JP); Atsuko Sakata, Mie (JP); Kengo Uchida, Oita (JP); Kazuyuki Higashi, Oita (JP); Mitsuyoshi Endo, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 1 day.

(21) Appl. No.: 14/484,400

(22) Filed: Sep. 12, 2014

(65) Prior Publication Data
US 2015/0262913 A1 Sep. 17, 2015

(30) Foreign Application Priority Data

Mar. 14, 2014 (JP) ................................. 2014-052126

(51) Int. Cl.
*H01L 23/48* (2006.01)
*H01L 23/00* (2006.01)

(52) U.S. Cl.
CPC .............. *H01L 23/481* (2013.01); *H01L 24/13* (2013.01); *H01L 2224/13023* (2013.01); *H01L 2224/13025* (2013.01); *H01L 2924/01005* (2013.01); *H01L 2924/01006* (2013.01); *H01L 2924/01013* (2013.01); *H01L 2924/01015* (2013.01); *H01L 2924/01022* (2013.01); *H01L 2924/01028* (2013.01); *H01L 2924/01029* (2013.01); *H01L2924/01042* (2013.01); *H01L 2924/01074* (2013.01); *H01L 2924/206* (2013.01)

(58) Field of Classification Search
CPC .................................................... H01L 23/481
USPC .................................. 257/737, 751; 438/614
See application file for complete search history.

(56) References Cited

U.S. PATENT DOCUMENTS 7,541,677 B2 6/2009 Kawano
2009/0130479 A1* 5/2009 Detor et al. ................... 428/615
(Continued)

FOREIGN PATENT DOCUMENTS

JP 11-345933 12/1999
JP 11-345934 12/1999
(Continued)

OTHER PUBLICATIONS

L. Hoffmann et al., "Investigations on partially filed HAR TSVs for MEMs applications", 2013 IEEE International Interconnect Technology Conference, 3 pages (2013).

*Primary Examiner* — Cuong Q Nguyen
*Assistant Examiner* — Tong-Ho Kim
(74) *Attorney, Agent, or Firm* — Finnegan, Henderson, Farabow, Garrett & Dunner, LLP

(57) ABSTRACT

A semiconductor device including a semiconductor substrate having a first surface and a second surface, the first surface being configured for formation of a semiconductor element; a through hole extending through the semiconductor substrate; and a through electrode disposed in the through hole. The through electrode includes an insulating film disposed along a sidewall of the through hole, a conductive layer comprising a first material disposed along the insulating film, and an electrode layer comprising a second material filled inside the through hole over the conductive layer. The first material is softer than the second material. The second material has a melting point higher than a melting point of the first material. The electrode layer includes a void portion being closed near the second surface of the semiconductor substrate.

14 Claims, 7 Drawing Sheets

(56) References Cited

U.S. PATENT DOCUMENTS

2013/0119547 A1* 5/2013 Kim et al. .................... 257/751
2014/0284772 A1* 9/2014 Ogiso et al. .................. 257/621
2015/0069614 A1* 3/2015 Nishikawa et al. ........... 257/766

FOREIGN PATENT DOCUMENTS

JP  2005-294577  10/2005
JP  2009-295719  12/2009

* cited by examiner

SEMICONDUCTOR DEVICE

CROSS-REFERENCE TO RELATED APPLICATION(S)

This application is based upon and claims the benefit of priority from Japanese Patent Application No. 2014-052125, filed on, Mar. 14, 2014 the entire contents of which are incorporated herein by reference.

FIELD

Embodiments disclosed herein generally relate to a semiconductor device.

BACKGROUND

A through electrode, one example of which is a TSV (through silicon via), typically comprises a via filled with metal extending through a semiconductor substrate. Some types of metal filling the via may produce internal stress within the through electrode which may in turn stress the semiconductor substrate. This may lead to formation of via cracks, malfunctioning of elements disposed near the through electrode, etc.

It is thus, being proposed to relax the internal stress produced within the via during the formation of the through electrode by pattern layout arrangements, structural arrangements, etc. For example, copper (Cu) employed as the through electrode may be shaped like a hollow pipe to achieve stress relaxation. However, because copper is migration-prone, such structure may have reliability issues originating from electro-migration. Further, the through electrode, being shaped like a pipe, has an upper opening and thus, may allow upper wirings for example formed thereabove to collapse into the opening.

DESCRIPTION

In one embodiment, a semiconductor device includes a semiconductor substrate having a first surface and a second surface, the first surface being configured for formation of a semiconductor element; a through hole extending through the semiconductor substrate; and a through electrode disposed in the through hole. The through electrode includes an insulating film disposed along a sidewall of the through hole, a conductive layer comprising a first material disposed along the insulating film, and an electrode layer comprising a second material filled inside the through hole over the conductive layer. The first material is softer than the second material. The second material has a melting point higher than a melting point of the first material. The electrode layer includes a void portion being closed near the second surface of the semiconductor substrate.

Embodiments are described hereinafter with references to the accompanying drawings. The drawings are not drawn to scale and thus, do not reflect the actual measurements of the features such as the correlation of thickness to planar dimensions and the ratio of thicknesses of each of the layers. Further, directional terms such as up, down, lower, left, and right are used in a relative context with an assumption that the surface, on which circuitry is formed, of the later described, semiconductor substrate faces up or down. Thus, the directional terms do not necessarily correspond to the directions based on gravitational acceleration.

FIRST EMBODIMENT

A description is given hereinafter on a first embodiment with reference to FIGS. 1 and 2.

Figure 1:
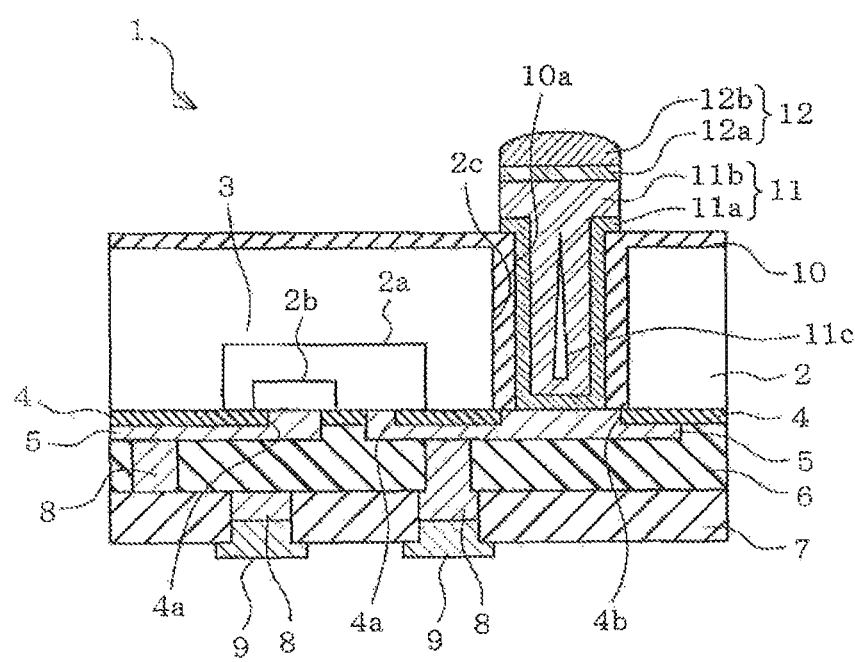
FIG. 1 is one example of a vertical cross-sectional view schematically illustrating a first embodiment.

FIG. 1 schematically illustrates a vertical cross-sectional surface of semiconductor device 1 having a through electrode. Referring to FIG. 1, semiconductor device 1 is provided with silicon substrate 2 serving as a semiconductor substrate. In a first surface, located in the under surface side of silicon substrate 2, as viewed in FIG. 1, semiconductor element 3 is formed. After forming semiconductor element 3, silicon substrate 2 is thinned to a thickness ranging from 20 µm to 40 µm for example.

As illustrated in FIG. 1, semiconductor element 3 is provided, for example, with impurity regions 2a and 2b formed in semiconductor substrate 2. Impurity regions 2a and 2b are each doped with p-conductivity type or n-conductivity type impurities of a predetermined concentration to become either a p-type impurity region or an n-type impurity region. The structure of semiconductor element 3 illustrated in FIG. 1 is merely an example and thus, it is possible to employ one or more semiconductor elements 3 having various structures. One such example is semiconductor element 3 including a gate electrode in the first surface side of silicon substrate 2. In the first embodiment, semiconductor element 3 including impurity regions 2a and 2b serves as an example for simplicity.

As illustrated in FIG. 1, insulating film 4 is formed along the first surface of silicon substrate 2 so as to cover the first surface. Openings 4a are formed through insulating film 4 where contacts are to be established. Further, openings 4b are formed through insulating film 4 where through electrodes 11 are to be formed. Along the surface of insulating film 4, wiring patterns 5 are formed so as to establish contact between impurity regions 2a and 2b of semiconductor element 3 and other components. Wiring pattern 5 may be formed of materials such as a nickel silicide (NiSi) or tungsten (W). Insulating film 4 may be formed of a silicon oxide film for example. The surfaces of wiring pattern 5 and insulating film 4 are covered by a stack of interlayer insulating films 6 and 7. Interlayer insulating films 6 and 7 may be formed of a silicon oxide film for example. Via holes filled with via plugs 8 are formed through interlayer insulating films 6 and 7. Bump 9 is formed along the surface portion of via plug 8.

Still referring to FIG. 1, through holes 2c extend through silicon substrate 2 in regions where semiconductor element 3 is not formed. As illustrated in FIG. 1, through hole 2c extends from the first surface side to the second surface side in the opposite side of the first surface side. In the first surface side of silicon substrate 2, wiring patterns 5 are exposed in the portion where openings 4b are formed through insulating film 4. Along the second surface of silicon substrate 2 as well as the sidewall of through hole 2c extending through silicon substrate 2, barrier insulating film 10 is formed so as to cover the second surface and the sidewall. Barrier insulating film 10 may comprise a silicon oxide film. Barrier insulating film 10 is formed so that the portion extending along the sidewall portion of through hole 2c is relatively thicker than the portion extending along the second surface. Through hole 2c being lined by barrier insulating film 10 is configured to have an inner diameter of approximately 10 μm for example exclusive of the thickness of barrier insulating film 10.

Inside through hole 2c, through electrode 11, configured as a TSV, is formed in the inner peripheral side of barrier insulating film 10. Through electrode 11 is provided for establishing electrical connection with wiring pattern 5 formed in the first surface side of silicon substrate 2.

In the first embodiment, through electrode 11, comprises conductive layer 11a and nickel (Ni) layer 11b. Conductive layer 11a is formed along barrier insulating film 10 and wiring pattern 5 so as to contact barrier insulating film 10 and wiring pattern 5. In the first embodiment, conductive layer 11a is formed of for example a barrier metal film and a seed metal film. One example of the barrier metal film is a titanium (Ti) film. One example of the seed metal film is copper (Cu) film. The thickness of conductive layer 11a may range from 3 nm to 200 nm for example. As illustrated in FIG. 1, conductive layer 11a extending along barrier insulating film 10 in the up and down direction further extends toward the second surface side from opening 10a of barrier insulating film 10.

In the inner side of conductive layer 11a, nickel layer 11b is filled to serve as an electrode layer. Nickel layer 11b is filled so as to protrude upward along and above opening 10a of barrier insulating film 10. Nickel layer 11b is formed to fill through hole 2c, however, void 11c is formed in through hole 2c as illustrated for example in FIG. 1. As will be later described, void 11c is formed during conformal formation of nickel layer 11b as deposition occurs increasingly near the opening in the upper portion of through hole 2c, and thereby encloses through hole 2c before filling its interior.

Above the upper surface of nickel layer 11b, located in the portion of through electrode 11 protruding from the second surface side of silicon substrate 2, bump 12 is formed. Bump 12 comprises copper (Cu) film 12a and tin (Sn) film 12b. As a result, through electrode 11 extends through silicon substrate 2 from the second, surface side to establish electric contact with wiring pattern 5 in the first surface side.

In the first embodiment described above, through, electrode 11 is formed through silicon substrate 2. Through electrode 11 includes a seed metal film comprising a copper film and nickel layer 11b formed in the inner side of the seed metal film, and void 11c is formed in nickel layer 11b. Through electrode 11 primarily comprises nickel (Ni) which has a melting point (melting point of 1300 degrees Celsius or higher) higher than the melting point (melting point of 1100 degrees Celsius or less) of copper. As a result, it is possible to suppress migration. It is further possible to relax internal stress by providing void 11c inside nickel layer 11b and thereby provide a reliable through electrode 11. Further, it possible to achieve stress relaxation of nickel layer 11b by providing conductive layer 11a.

Figure 2A:
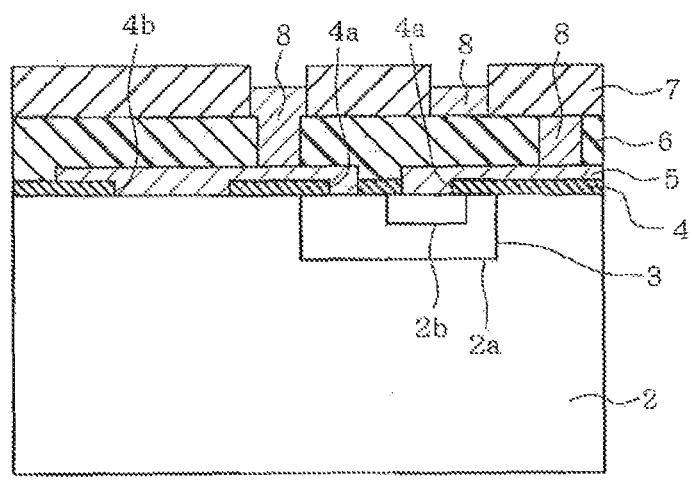
FIGS. 2A to 2I are examples of vertical cross-sectional views schematically illustrating one phase of a manufacturing process flow.
Figure 2B:
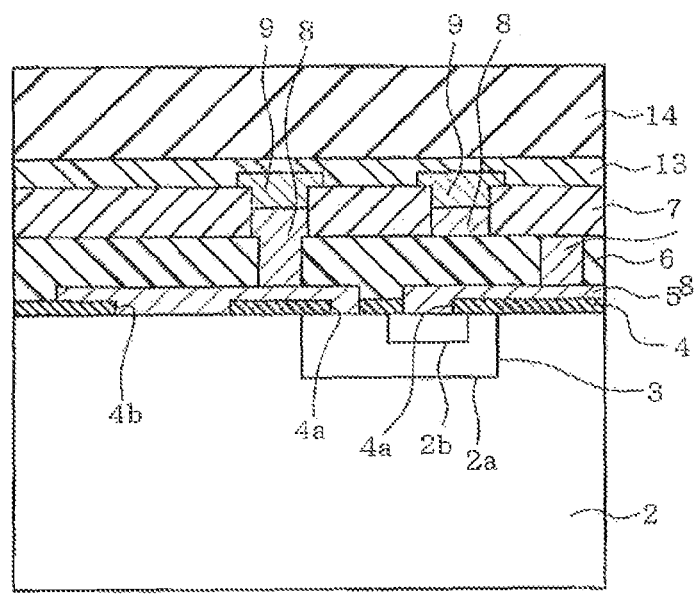

Next, a description will be given on one example of a manufacturing process flow of the above described structure with reference to FIGS. 2A to 2I. FIGS. 2A and 2B illustrate process steps for processing the first surface side of silicon substrate 2 and thus, their orientations differ from FIG. 1 by 180 degrees, meaning that substrate 2 is turned up side down. Referring first to FIG. 2A, components of semiconductor element 3 such as impurity regions 2a and 2b are formed in and/or above the upper surface of the first surface side of silicon substrate 2. As described earlier, semiconductor element 3 may further comprise gate electrodes formed above the first surface of silicon substrate 2.

Then, insulating film 4 is formed above the first surface of silicon substrate 2. Insulating film 4 may be formed of a silicon oxide film for example. Openings 4a and 4b are formed in predetermined regions of insulating film 4 by lithography. Opening 4a of insulating film 4 serves as a contact region for allowing connection to the terminals of semiconductor element 3. Opening 4b serves as a pattern region for allowing connection to through electrode 11. Next, wiring pattern 5 processed into a predetermined, pattern is formed above the upper surface of insulating film 4. Wiring pattern 5 is formed by forming a metal film above the entire surface and etching the metal film into a predetermined pattern by lithography. Wiring pattern 5 establishes electric connection with the elements formed in the first surface of silicon substrate 2 through, openings 4a and 4b of insulating film 4. Connections between the terminals of semiconductor element 3, as well as connections to patterns for accessing external components are established through wiring pattern 5.

Next, interlayer insulating film 6 is formed above the upper surfaces of wiring pattern 5 and insulating film 4, Interlayer insulating film 6 comprises for example a silicon oxide film. Then, a via is formed so as to extend in the up and down direction through interlayer insulating film 6 and is filled with a plug to obtain via plug 8 connecting to wiring pattern 5. Thereafter, insulating film 7 used for forming a bump is formed above the upper surface of insulating film 6. An opening is formed through insulating film 7 where the bump is to be formed. The opening is filled with a metal plug, used in filling via plug 8 extending through insulating film 6, in order to form via plug 8 used for forming the bump.

Then, as illustrated in FIG. 2B, bump 9 is partially formed for establishing connection with via plug 8. Next, adhesive layer 13 is formed above insulating film 7 and bump 9 exposed in the first surface side of silicon substrate 2. Then, glass substrate 14 is adhered to adhesive layer 13. Glass substrate 14 serves as a supporting member when silicon substrate 2 is thinned by polishing.

Figure 2C:
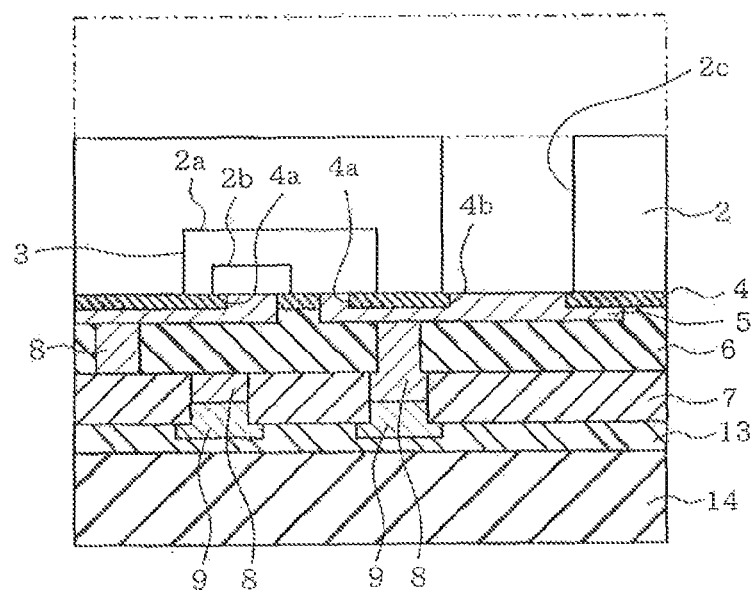

Next, as illustrated in FIG. 2C, silicon substrate 2 is polished from the under surface in the second surface side. In FIG. 2C and figures after FIG. 2C, the second surface side of silicon substrate 2 faces up as was the case in FIG. 1 for describing the formation of through electrode 11. The polish process is performed so that the post-polish thickness of silicon substrate 2 has a predetermined thickness ranging from 20 μm to 40 μm for example. The thickness of silicon, substrate 2 is specified based on the thickness required in packaging the diced chips.

Next, resist is formed above the under surface in the second surface side of silicon substrate 2. The resist is thereafter patterned by lithography to form openings for forming through hole 2c. Then, using the resist pattern as a mask, silicon substrate 2 is dry etched from the second surface side to the first surface side. The etching is stopped when wiring pattern 5 in the first surface side of silicon substrate 2 is exposed to thereby form through hole 2c.

Figure 2D:
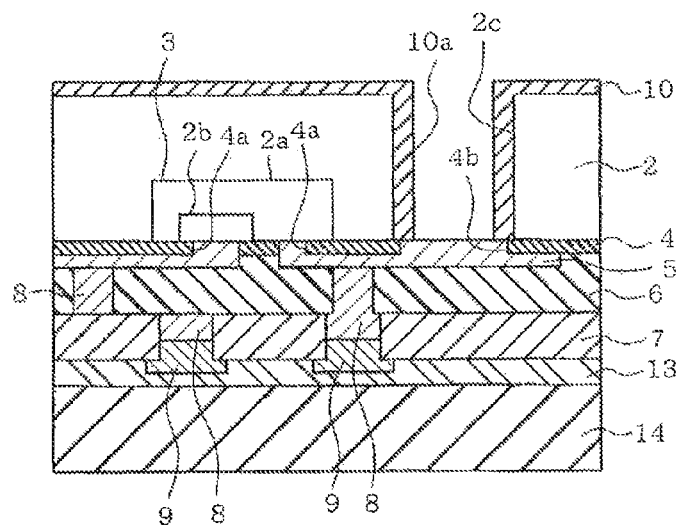

Next, as illustrated in FIG. 2D, barrier insulating film 10 is formed along the second surface of silicon substrate 2 and along the walls of through hole 2c. Barrier insulating film 10 may be formed of a silicon oxide film for example. Barrier insulating film 10 is initially formed in substantially the same thickness along the second surface of silicon substrate 2 and along the sidewall of through hole 2c. Barrier insulating film 10 formed along the bottom surface of through hole 2c, however, is slightly thinner because the hole is deep. Then, barrier insulating film 10 is removed from the bottom surface of through hole 2c by anisotropic etching. When the etch back is stopped after the relatively thin barrier insulating film 10 along the bottom surface of through hole 2c is removed, the relatively thick barrier insulating film 10 along the second surface of silicon substrate 2 remains though may be slightly thinned. Further, barrier insulating film 10 formed along the sidewall of through hole 2c remains substantially unetched since this portion of barrier insulating film 10 is oriented substantially in the vertical direction. As a result, barrier insulating film 10 is formed above the second surface of silicon substrate 2 and along the sidewall of through hole 2c, while being removed from the bottom surface portion of through hole 2c to expose wiring pattern 5.

Figure 2E:
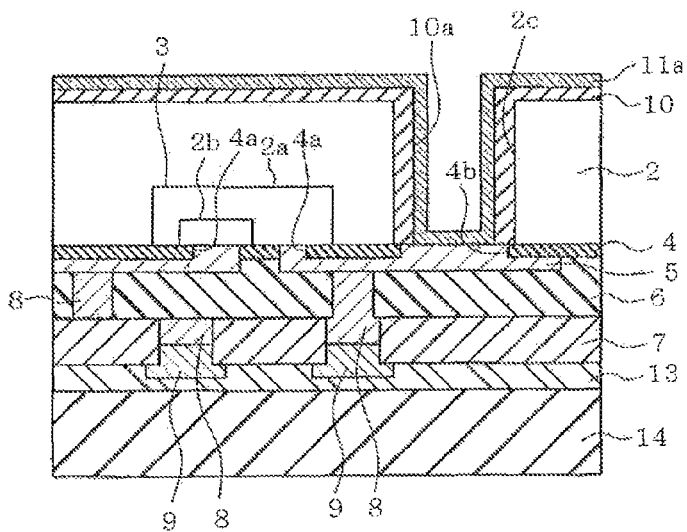

As illustrated in FIG. 2E, conductive layer 11a of through electrode 11 is formed so as to cover the upper surfaces of barrier insulating film 10 and wiring pattern 5 serving as the bottom, surface of through hole 2c. Formation of conductive layer 11a begins by forming a barrier metal film by sputtering for example followed by formation of a seed metal film. In one embodiment, titanium film is used as the barrier metal film and copper film is used as the seed metal film (Ti/Cu).

Copper used in forming the seed metal film may be formed of materials other than copper such as a nonmagnetic material. In one embodiment, the seed metal film is formed in a thickness ranging from 3 to 200 nm. The thickness of the seed metal film, however, may be greater than the range of 3 to 200 nm. The barrier metal film may be omitted in case barrier insulating film 10 in through hole 2c exhibits good adhesiveness.

Figure 2F:
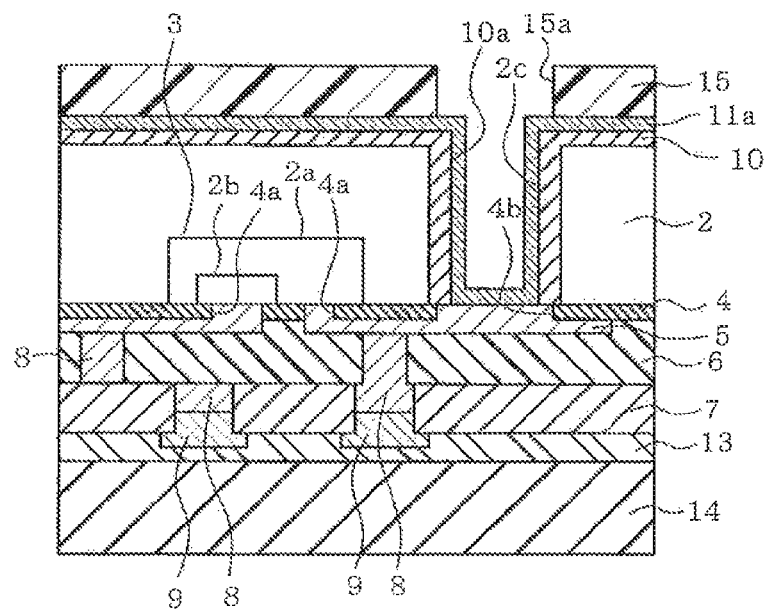

Then, as illustrated in FIG. 2F, resist film 15 is formed and patterned by lithography. Resist film 15 has opening 15a for forming through electrode 11. Opening 15a of resist film 15 exposes conductive layer 11a located in through hole 2c and a part of conductive layer 11a located above the second surface of silicon substrate 2.

Figure 2G:
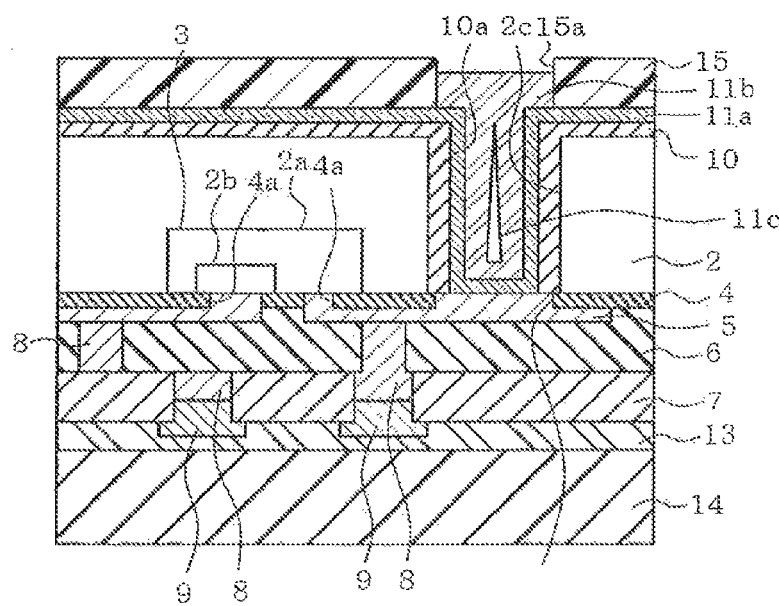

Then, as illustrated in FIG. 2G, nickel layer 11b is formed by plating using the patterned resist film 15 as a mask. More specifically, a nickel film is formed selectively and conformally along conductive layer 11a exposed by opening 15a of resist film 15. Nickel film is formed conformally using high-density electric current and thus forms differently from and faster than a bottom-up approach.

The nickel film forms substantially in the same thickness along conductive layer 11a. However, the nickel film forms at a relatively higher rate locally near the top opening of through hole 2c in the second surface side and thus, tends to close the opening before filling the interior of through hole 2c. As a result, nickel layer 11b is closed in the upper portion of through hole 2c while leaving void 11c in through hole 2c. The plating is continued until nickel layer 11b reaches a predetermined height within opening 15a of resist film 15.

Figure 2H:
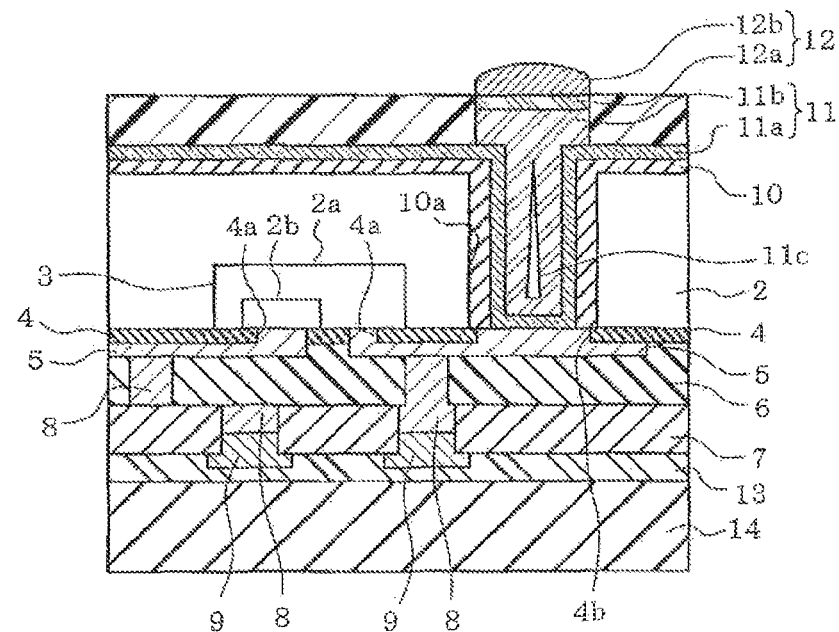

Then, as illustrated in FIG. 2H, bump 12 is formed above the upper portion of through electrode 11. Formation of bump 12 begins with plating of copper (Cu) film 12a followed by plating of tin (Sn) film 12b. As illustrated in FIG. 2H, tin film 12b is slightly bulged.

Figure 2I:
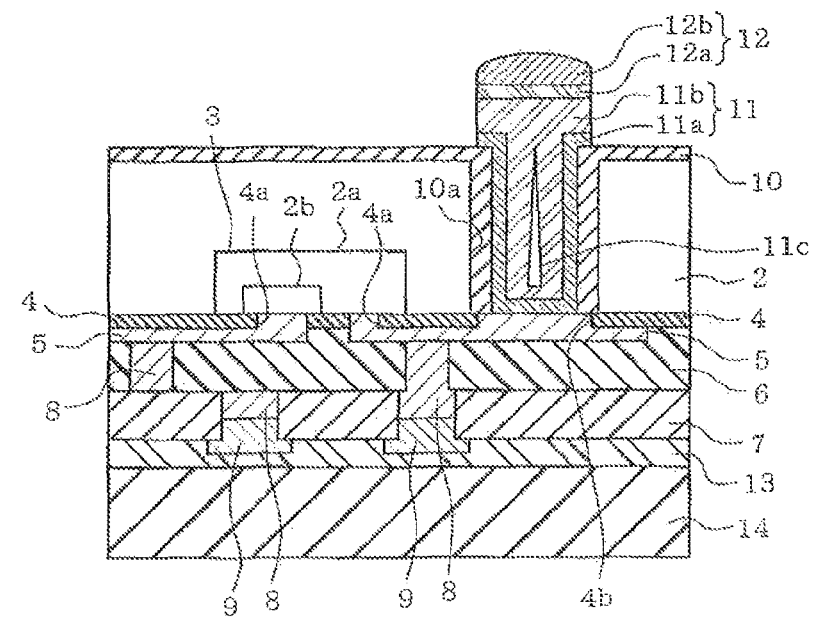

Then, as illustrated in FIG. 2I, resist film 15 is stripped and the exposed conductive film 11a is removed by etching. In one embodiment, conductive film 11a is removed by wet etching. Thereafter, bump 12 is finished by reflow.

Next, the wafer is diced into chips and adhesive layer 13 is melted to remove glass substrate 14. Semiconductor device 1 provided with through electrode 11 is obtained by the above described process flow.

In the above described process flow, nickel layer 11b is formed conformally into through hole 2c by plating without having to take the bottom-up approach. Thus, it is possible to form nickel layer 11b in a shorter time period as compared to the bottom-up approach.

In the first embodiment described above, nickel having a higher melting point compared to copper is used as the primary material for forming through electrode 11. In through electrode 11 configured as described above, it is possible to suppress negative impacts originating from internal stress while inhibiting degradation of electromigration resistivity. Further, through electrode 11 is formed, primarily of metal in the form of a conformal nickel layer 11b formed by plating. Thus, it is possible to form through electrode 11 in a shorter time period as compared to a bottom-up approach while enabling the formation of void 11c.

In addition to the provision of nickel layer 11b which is not migration prone even in the presence of void 11c therein, through electrode 11 is further provided with conductive layer 11a including a copper film which is disposed in the outer side of nickel layer 11b. Metals with high melting points generally have high Young's Modulus. For example, Young's modulus of nickel is approximately 200 GPa while Young's modulus of copper is approximately 110 GPa. Thus, it is possible to absorb the internal stress developed in nickel layer 11b by conductive layer 11a which employs materials having lower Young's modulus than and thereby softer than nickel. As a result, it has been found that the internal stress inflicted on silicon substrate 2 by through electrode 11 can be reduced to approximately 12 as compared to when nickel is used alone.

Further, void 11c of nickel layer 11b is configured to be closed near the second surface of silicon substrate 2. Thus, it is possible to form nickel layer 11b in sufficient thickness to allow formation of a bump structure in the upper portion of through electrode 11. As a result, bump 12 can be formed easily without allowing intrusion of metal into void 11c of nickel layer 11b.

SECOND EMBODIMENT

Figure 3:
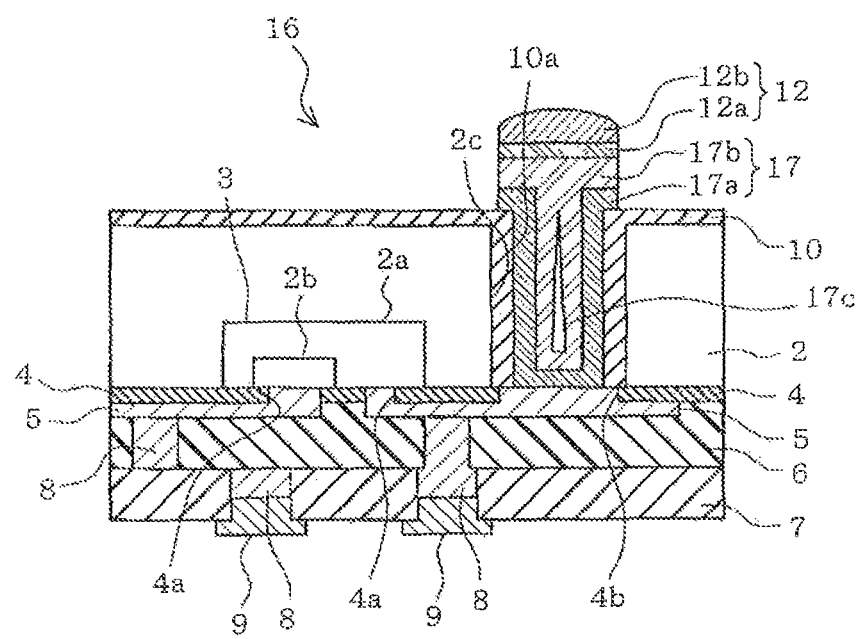
FIG. 3 is one example of a vertical cross-sectional view schematically illustrating a second embodiment.

FIG. 3 illustrates semiconductor device 16 of a second embodiment. The second embodiment differs from the first embodiment in that semiconductor device 16 is provided with through electrode 17 instead of through electrode 11. In the first embodiment, nickel layer 11b including void 11c was employed to achieve stress relaxation, and inhibit migration. Nickel (Ni) of nickel layer 11b, being a magnetic material, may become subjected to a skin effect in which smooth electric current flow through electrode 11 is inhibited when semiconductor device 1 is operating under high frequency. As a result, electric current flows mostly in the surface layer portion and less in the central portion of through electrode 11, thereby increasing the resistance as a whole.

In the second embodiment, conductive layer 17a is provided in through electrode 17 in order to inhibit elevation of resistance caused by the skin effect observed when a magnetic material, nickel layer 17b in this case, is used as through electrode 17 when semiconductor device 16 is used under high frequencies.

As illustrated in FIG. 3, conductive layer 17a is formed of for example a barrier metal film and a seed metal film. One example of the barrier metal film is a titanium (Ti) film. One example of the seed metal film, is a copper (Cu) film. Conductive layer 17a of the second embodiment is thicker than conductive layer 11a of the first embodiment considering the thickness of conductive layer 17a occupied by skin effect current. In the second embodiment, the thickness of the copper film is configured to 200 nm or greater for example. As illustrated in FIG. 3, conductive layer 17a extending along barrier insulating film 10 in the up and down direction further extends toward the second surface side from opening 10a of barrier insulating film 10.

In the inner side of conductive layer 17a, nickel layer 17b is filled so as to protrude upward along and above opening 10a of barrier insulating film 10. Nickel layer 17b is formed to fill through hole 2c, however, void 17c is formed in through hole 2c as illustrated for example in FIG. 3. Void 17c is formed during conformal formation of nickel layer 17b as deposition occurs increasingly near the opening in the upper portion of through hole 2c, and thereby encloses through hole 2c before filling its interior.

In the second embodiment, through electrode 17 employs a copper film having a thickness of 200 nm or greater as conductive layer 17a in applications where semiconductor device 16 is driven under high frequencies. Thus, it is possible to suppress the magnetic skin effect and thereby inhibit resistance elevation caused by the use of magnetic material, in this case, nickel layer 17b.

Further, in the second embodiment, copper film having a thickness of 200 nm or greater is used in conductive layer 17a, which is thicker than the copper film used in conductive layer 11a of the first embodiment. As described earlier, cooper is softer (has lower Young's modulus) than nickel and thus, the copper film, being thicker than in the first embodiment, achieves stress relaxation even more effectively as compared to the first embodiment.

THIRD EMBODIMENT

Figure 4:
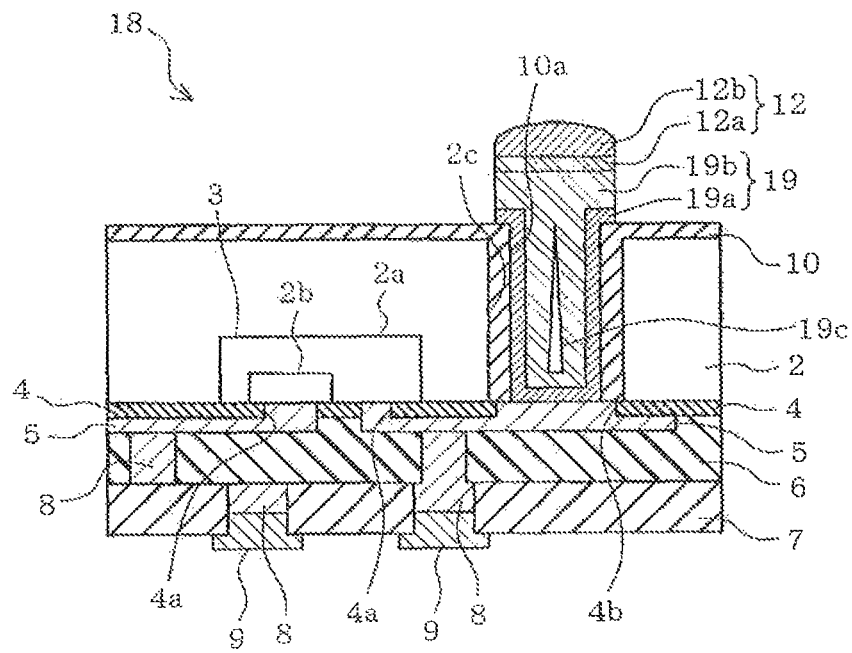
FIG. 4 is one example of a vertical cross-sectional view schematically illustrating a third embodiment.

FIG. 4 illustrates semiconductor device 18 of a third, embodiment. The third embodiment differs from the second embodiment in that semiconductor device 13 is provided with through electrode 19 instead of through electrode 17. In the third embodiment, demagnetized nickel layer 19b is employed as through electrode 19 in order to inhibit resistance elevation caused by the skin effect encountered when semiconductor device 18 is used under high frequency.

As illustrated in FIG. 4, through electrode 19 includes conductive layer 19a which is formed of for example a barrier metal film and a seed metal film. One example of the barrier metal film, is a titanium (Ti) film. One example of the seed metal film is a copper (Cu) film. The thickness of conductive layer 19a of the third embodiment may range from 3 nm to 200 nm as was the case in the first embodiment and preferably from 20 nm to 200 nm. As illustrated in FIG. 4, conductive layer 19a extending along barrier insulating film 10 in the up and down direction further extends toward the second surface side from opening 10a of barrier insulating film 10. The film structure of conductive layer 19a may be similar to the film structure of conductive layer 17a of the second embodiment.

In the inner side of conductive layer 19a, nickel layer 19b is filled so as to protrude upward along and above opening 10a of barrier insulating film 10. Nickel layer 19b is formed to fill through hole 2c, however, void 19c is formed in through hole 2c as illustrated for example in FIG. 4. Void 19c is formed during conformal formation of nickel layer 19b as deposition occurs increasingly near the opening in the upper portion of through hole 2c, and thereby encloses through hole 2c before filling its interior.

Nickel layer 19b is formed by plating nickel containing 5 wt % or more of nonmagnetic material, more preferably 8 wt % or more, so that at least the side contacting conductive layer 19a located in the outer side of nickel layer 19b is demagnetized. Examples of additives used for demagnetization include carbon (C), phosphorous (P), boron (B), aluminum (Al), molybdenum (Mo), and tungsten (W). In through electrode 19 configured as described above, the magnetic properties possessed by nickel of nickel layer 19b is weakened. As a result, it is possible to inhibit resistance elevation caused by the skin effect, encountered during high-frequency operation.

FOURTH EMBODIMENT

Figure 5:
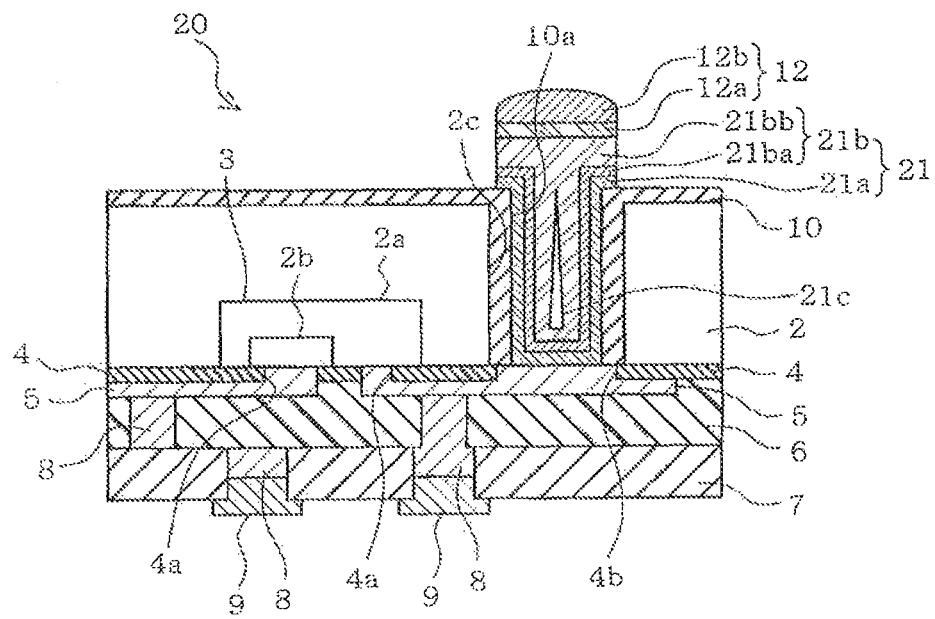
FIG. 5 is one example of a vertical cross-sectional view schematically illustrating a fourth embodiment.

FIG. 5 illustrates semiconductor device 20 of a fourth embodiment. The fourth embodiment differs from the second embodiment in that semiconductor device 20 is provided with through electrode 21 instead of through electrode 17. In the fourth embodiment, nickel layer 21b is employed as through electrode 20 when semiconductor device 20 is used under high frequencies. Nickel layer 21b includes a demagnetized fine grain layer 21ba and nickel layer 21bb provided in the inner side of fine grain layer 21ba. As a result, resistance elevation caused by the skin effect in nickel layer 21b is inhibited.

As illustrated in FIG. 5, through electrode 21 includes conductive layer 21a which is formed, of for example a barrier metal film and a seed metal film. One example of the barrier metal film is a titanium (Ti) film. One example of the seed metal film is a copper (Cu) film. The thickness of conductive layer 21a of the fourth embodiment may range from 3 nm to 200 nm as was the case in the first, embodiment and preferably from 20 nm to 200 nm. As illustrated in FIG. 5, conductive layer 21a extending along barrier insulating film 10 in the up and down direction further extends toward the second surface side from opening 10a of barrier insulating film 10. The film structure of conductive layer 21a may be similar to the film structure of conductive layer 17a of the second embodiment.

In the inner side of conductive layer 21a, nickel layer 21b is filled so as to protrude upward along and above opening 10a of barrier insulating film 10. Nickel layer 21b includes fine grain layer 21ba and nickel layer 21bb filled in the inner side of fine grain layer 21ba. Fine grain layer 21ba is formed in the portion contacting conductive layer 21a located in its outer side. Nickel layer 21b is formed to fill through hole 2c, however, void 21c is formed in through hole 2c as illustrated for example in FIG. 5. Void 21c is formed during conformal formation of nickel layer 21b as deposition occurs increasingly near the opening in the upper portion of through hole 2c, and thereby encloses through hole 2c before filling its interior.

Nickel layer 21b is formed by plating as was the case in the third embodiment with an exception that fine-grain layer 21ba is formed as the initial layer. In forming fine-grain layer 21ba, the diameters of the crystal grains are controlled to approximately 10 nm or less by performing the plating process using high-density electric current for example. The diameters of the fine crystal grains may be measured for example by tem (Transmission Electron Microscope). The level of magnetization of fine-grain layer 21ba is weakened by arranging the orientations of the fine crystals to be random. Resistance elevation caused, by the skin effect is inhibited in the above described manner. The formation of fine-grain layer 21ba is followed by the formation of nickel layer 21bb using electric current of normal density whereby void 21c is formed in nickel layer 21bb. Nickel layer 21bb may be formed by a plating process using electric current of normal density as described above or by using high-density electric current at higher formation rate. Thus, in through electrode 21 configured as described above, the magnetic properties possessed by nickel of nickel layer 21b is weakened. As a result, it is possible to inhibit resistance elevation caused by the skin effect encountered during high-frequency operation.

MODIFIED EMBODIMENTS

The embodiments described above may be modified as follows.

Through electrodes 11, 17, 19, and 21 were described through examples of semiconductor devices 1, 16, 18, and 20 formed using the so-called via last approach in which the through electrode formation takes place toward the end of the wafer process. Alternatively, the through electrodes may be implemented in semiconductor devices formed using the so-called via first approach or the via middle approach.

Copper used as the seed metal in conductive layers 11a, 17a, 19a, and 21a may be replaced by other metals. Such alternative materials preferably exhibit Young's modulus less than Young's modulus of nickel used in nickel layers 11b, 17b, 19b, and 21b.

In case the adhesion of the seed metal to barrier insulating film 10 is good, the barrier metal need not be provided in conducive layers 11a, 17a, 19a, and 21a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate having a first surface and a second surface, the first surface being configured for formation of a semiconductor element;
a wiring pattern formed along the first surface;
a through hole extending through the semiconductor substrate and reaching a portion of the wiring pattern; and
a through electrode disposed in the through hole and connected to the wiring pattern at the first surface, the through electrode including an insulating film disposed along a sidewall of the through hole, a conductive layer comprising a titanium film disposed along the insulating film and a copper film disposed along a surface of the titanium film, and an electrode layer comprising a nickel film filled inside the through hole over the conductive layer, the conductive layer being softer than the electrode layer, the electrode layer having a melting point higher than a melting point of the conductive layer, and the electrode layer including a void portion enclosed therein and having an end portion disposed near the second surface of the semiconductor substrate.

2. The device according to claim 1, wherein the conductive layer has a thickness ranging from 3 nm to 200 nm.

3. The device according to claim 1, further comprising a bump disposed above the through electrode so as to be located in a second surface side of the semiconductor substrate.

4. The device according to claim 1, wherein the conductive layer has a thickness equal to or greater than 200 nm.

5. The device according to claim 1, wherein the electrode layer includes a demagnetized layer at least in one side proximal to the conductive layer.

6. The device according to claim 5, wherein the demagnetized layer of the electrode layer includes at least one nonmagnetic material.

7. The device according to claim 5, wherein the demagnetized layer of the electrode layer is demagnetized by fine crystallization.

8. The device according to claim 5, wherein the the demagnetized layer comprises a demagnetized nickel.

9. The device according to claim 8, wherein the demagnetized nickel includes at least one nonmagnetic material.

10. The device according to claim 9, wherein the demagnetized nickel includes 5 wt % or more of the nonmagnetic material.

11. The device according to claim 9, wherein the demagnetized nickel includes 8 wt % or more of the nonmagnetic material.

12. The device according to claim 9, wherein the at least one nonmagnetic material is one or more materials selected from the group consisting of carbon, phosphorous, boron, aluminum, molybdenum, and tungsten.

13. The device according to claim 8, wherein the demagnetized layer comprises a demagnetized fine-grain layer.

14. The device according to claim 13, wherein the demagnetized layer comprises a crystal grain having a crystal grain diameter of 10 nm or less.

* * * * *